United States Patent [19]
Yasuzato et al.

[11] Patent Number: 5,792,596
[45] Date of Patent: Aug. 11, 1998

[54] PATTERN FORMING METHOD

[75] Inventors: Tadao Yasuzato; Shinji Ishida; Kunihiko Kasama; Yoko Iwabuchi, all of Tokyo, Japan

[73] Assignee: NEC Corporation, Tokyo, Japan

[21] Appl. No.: 595,916

[22] Filed: Feb. 6, 1996

[30] Foreign Application Priority Data

Feb. 17, 1995 [JP] Japan ................................. 7-053290

[51] Int. Cl.$^6$ ............................. G03F 7/20; G03F 7/207
[52] U.S. Cl. ...................... 430/327; 430/311; 430/394; 430/396
[58] Field of Search ................................. 430/311, 313, 430/322, 327, 394, 396

[56] References Cited

U.S. PATENT DOCUMENTS 5,476,736 12/1995 Tanabe ................................. 430/394
5,525,192 6/1996 Lee ................................. 430/327
5,554,489 9/1996 Ishibashi ................................. 430/327

FOREIGN PATENT DOCUMENTS 3170935 7/1991 Japan .
4136854 5/1992 Japan .

*Primary Examiner*—Kathleen Duda
*Attorney, Agent, or Firm*—Whitham, Curtis, Whitham & McGinn

[57] ABSTRACT

In a method of forming a pattern, a photo-mask including a desired pattern is provided. A photo-sensitive resin film is spin-coated on a semiconductor substrate. Subsequently, the surface of the photo-sensitive resin film is changed to have a resistivity against a development solution. Next, light is illuminated to transmit the photo-mask. As a result, the resistivity of only the surface portion of the photo-sensitive resin film corresponding to the desired pattern is decreased based on the property of photo-sensitive resin film by the light having transmitted the photo-mask. Last, the photo-sensitive layer is developed with the development solution.

14 Claims, 21 Drawing Sheets

FOCUS CHARACTERISTIC OF 0.35 μm CONTACT HOLE

Mask Bias : 0.1 μm

Mask bias 0.05 μm

Mask bias : 0 μm 0.35 μm Contact hole   Mask bias 0.05 μm 0.35 μm Contact hole, Mask bias 0.05 μm

PATTERN FORMING METHOD

BACKGROUND OF THE INVENTION

1. Field of the Invention

The present invention relates to manufacture of a semiconductor device, and more particularly, to formation of a fine pattern of the semiconductor device.

2. Description of the Related Art

Conventionally, in a manufacturing process of a semiconductor device, a photo-lithography technique is used for formation of a pattern on a semiconductor substrate on which a semiconductor device is formed. In the lithography process, a pattern on a photo-mask is transferred by a reduction projection exposure apparatus on the semiconductor substrate on which a photo-sensitive resin is coated. The patten of the photo-sensitive resin corresponding to the photo-mask pattern can be obtained through development. The photo-mask is a transparent substrate on which the pattern composed of a transparent region and an opaque region is formed. A photo-mask having a reduction ratio being not 1:1 is specifically called a reticule. However, both types of photo-mask are referred to as a photo-mask in the application.

In the photo-lithography technique, a fine pattern of a semiconductor device has been achieved by the development of an exposure apparatus, specifically, employment of a projection lens having a high numerical aperture (NA). NA indicates how much the lens collects light, i.e., how fine the lens can resolve an image. A great value of NA indicates that the lens has a good performance. Further, as known as the Rayleigh equation, there is a relation, $R = k1 \times \lambda/NA$ between NA and a critical resolution R, where R means that a critical resolvable size of a fine pattern, K1 is a constant dependent upon process parameters such as the performance of the photo-sensitive resin, and $\lambda$ is a wavelength of light. Accordingly, by making NA great, the critical resolution R has been improved for a fine pattern. Thus, the resolution can be improved by employing an exposure apparatus having a great NA, but the depth of focus has been reduced, i.e., the allowable region of deviation of a focus position has been reduced. As a result, it is difficult to form a finer pattern because of the reduced depth of focus.

Although description of actual physical meaning is omitted, it is also well known as the Rayleigh equation described above that the following equation is satisfied:

$$DOF = k2 \times \lambda/NA$$

where k2 is a constant dependent upon process parameters. That is, the greater NA becomes, the smaller DOF becomes. Thus, a little deviation of the focus position is not allowable. For this reason, the improvement of resolution and depth of focus by phase-shift mask technique has been discussed. A phase-shift mask called the Shibuya-Levenson type photo-mask was first proposed which was adaptive for a periodic pattern and in which the phase of light transmitting a transparent region was alternately changed by 180 degrees. However, since the limitation of the pattern to which the phase-shift mask can be applied is severe, other types of phase-shift mask are proposed such as an auxiliary pattern type and a rim type. Further, there has conventionally been a problem that the allowable range of depth of focus is narrow. Accordingly, the phase-shift mask such as auxiliary pattern type, a rim type and half-tone type as described in Japanese Laid-Open Patent Disclosure (JP-A-Tokukaihei4-136854). Among these types, since the half-tone type phase-shift mask can be easily manufactured compared to the other types, attention is directed to the half-tone type phase-shift mask.

Next, the phase-shift mask will be described below with reference to FIGS. 1A to 1D, 2A to 2D, 3A to 3D, and 4A to 4D, in comparison with a conventional normal type photo-mask. FIGS. 1A to 1D are schematic diagrams of the normal type photo-mask. FIGS. 2A to 2D are schematic diagram illustrating an auxiliary pattern type phase-shift photo-mask. FIGS. 3A to 3D are schematic diagrams illustrating a conventional rim type phase-shift photo-mask, and FIGS. 4A to 4D are schematic diagrams illustrating a conventional half-tone type phase-shift photo-mask. A pattern of each of these photo-masks is used for a single contact hole.

First, the conventional normal type photo-mask will be described. FIG. 1A is a plan view of the photo-mask. FIG. 1B is a cross sectional view of the photo-mask cut along the line 1—1'. FIG. 1OC is a diagram showing a light amplitude distribution immediately after transmitting the photo-mask, and FIG. 1D is a diagram showing a light intensity distribution on an imaging plane. In the normal type photo-mask, as shown in FIG. 1B, on a transparent substrate 11 made of quartz is deposited a light shielding film 13 of 70 to 100 nm in thick composed of chrome (CR) and chrome oxide (CRO). The light shielding film 13 is selectively removed, so that a pattern composed of a transparent region 16 and shielding region 18 is formed. The light transmitting the photo-mask has the amplitude of a constant value in the transparent region 16 and of "0" in the shielding region 18. Generally, the amplitude of light transmitting an optical system is represented by Fourier transformation. The light emitted from a light source is Fourier-transformed in accordance with the photo-mask pattern and is subjected to Fourier inverse transformation in a projection lens system, so that a pattern corresponding to the original photo-mask pattern is formed on the imaging plane. However, in this case, since the projection lens system functions as a low pass filter, the high order components of the Fourier transformed light are lost. Accordingly, the light has a rectangular amplitude distribution at the photo-mask but the rectangular amplitude distribution is lost on the imaging plane. The light intensity distribution at that time has a gentle shape as shown in FIG. 1D.

Next, the conventional auxiliary pattern type phase-shift photo-mask will be described with reference to FIGS. 2A to 2D. FIG. 2A is a plan view of the auxiliary patten type photo-mask and FIG. 2B is a cross sectional view of the photo-mask cut along the line 2—2'. FIG. 2C is a diagram showing the amplitude distribution of light immediately after transmitting the photo-mask. FIG. 2D is a diagram showing a light intensity distribution on an imaging plane. In the auxiliary pattern type phase-shift photo-mask, as shown in FIGS. 2A and 2B, at the peripheral portion of a first transparent region 16a corresponding to the contact hole pattern to be transferred to a semiconductor substrate, second transparent regions 16b (an auxiliary pattern) having the size smaller than a critical resolution of an exposure apparatus are formed. The difference of 180 degree in phase is achieved between the light transmitting the first transparent region 16a and the light transmitting the second transparent region 16b by use of a transparent film 14. The transparent film 14 for providing the phase difference is called a phase shifter or a shifter simply. Since the light has the wavelength of 1/n in a substance, where n is the refractive index of the substance, the phase difference is generated between the light transmitting the transparent film 14 and the light traveling in air. The phase difference θ generated by the transparent film 14 is represented by the following equation:

θ=360×t×(n−1)/λ where λ is the wavelength of the exposure light, n is a refractive index of the transparent film material, and t is the film thickness of the transparent film. In order to achieve the phase difference of 180 degrees, the transparent film thickness t is set to be t=λ/2(n−1). The light transmitting the auxiliary pattern type phase-shift photo-mask has an amplitude distribution in which the light transmitting the transparent region 16a and the light transmitting the transparent region 16b have the opposite phases to each other. A light intensity distribution becomes more abrupt on the imaging plane because the light having the opposite phases cancels each other. However, as shown in FIG. 2D, sub-peaks appear in the neighborhood of the main peak corresponding to the contact hole pattern. The sub-peak is generally called side-lobe and is a phenomenon to be solved in various phase-shift photo-mask. That is, in order to increase the effect of the phase-shift method such that the depth of focus can be increased more, the sized of the second transparent regions 16b need to be enlarged. However, if the region 16b is enlarged, the side-lobe generated due to the second transparent region 16b is also enlarged in size at the same time, and the enlarged side-lobe is transferred to the resist pattern. Therefore, it is necessary to select the size of the second transparent region 16b such that the depth of focus can be increased to some extent and the transferred side-lobes can be in an allowable range. Note that a distance between the main pattern and the second transparent region 16b needs to be selected adequately. However, the optimal value to the distance can be easily determined and, therefore, only the size of the second transparent region 16b is investigated as a parameter.

Next, the rim type phase-shift photo-mask will be described below with reference to FIGS. 3A to 3D. FIG. 3A is a plan view of the rim type phase-shift photo-mask, FIG. 3B is a cross sectional view of the photo-mask of FIG. 3A cut along the line 3—3', FIG. 3C is an amplitude distribution of light immediately after transmitting the photo-mask, and FIG. 3D is a light intensity distribution on an imaging plane.

This type of photo-mask can be regarded as a type of phase-shift photo-mask in which the first transparent region 16a contacts the second transparent regions 16b in the auxiliary pattern type phase-shift photo-mask shown in FIGS. 2A to 2D. As shown in FIG. 3C, the light immediately after transmitting the photo-mask has the light amplitude distribution in which a light component transmitting the first transparent region 16a and a light component transmitting the second transparent region 16b have the opposite polarities by a transparent film 14. The light components having different polarities cancel in the vicinity of the edge of the transparent film so that a dark portion is formed. As a result, a main pattern having an abrupt slope in the light intensity distribution can be formed. As described, since the light intensity is decreased to a great extent at the edge portion of the transparent film 14, a mask bias is accounted for design of the photo-mask so that the size of the first transparent region 16a is greater than the target size of the contact hole pattern. In the rim type phase-shift photo-mask, a side-lobe is also generated as in the auxiliary pattern type phase-shift photo-mask. In order to increase the depth of focus, the mask bias is required to be small and the size of the second transparent regions 16b are required to be great. However, the side-lobe is also transferred as in the above-mentioned auxiliary pattern type phase-shift photo-mask. Accordingly, a mask pattern is optimized on the two conditions that the depth of focus can be increased and the transferred side-lobe can be in an allowable range, in the mask design of the rim type phase-shift photo-mask.

Last, a conventional half-tone type phase-shift photo-mask will be described with reference to FIG. 4A to 4D. FIG. 4A is a plan view of the half-tone type phase-shift photo-mask, FIG. 4B is a cross sectional view of the photo-mask cut along the line 4—4', FIG. 4C is a light amplitude distribution immediately after transmitting the photo-mask, and FIG. 4D is a light intensity distribution on the imaging plane.

This type photo-mask has a transparent region 16 and a semi-transparent region 17 by a semi-transparent film 12 formed of material such as chrome oxide on a transparent substrate 11 and having a predetermined film thickness. The phases of light components transmitting the transparent region 16 and the semi-transparent region 17 are different from each other by 180 degrees. In this type phase-shift photo-mask, the light components also cancel each other at the edge portion of the semi-transparent film 12 so that the light intensity distribution of the main pattern can be improved. However, since the light intensity is decreased to a great extent at the edge portion of the semi-transparent film 12, it is difficult to form an opening in a photo-sensitive resin to be equal to the mask size. Accordingly, it is necessary to apply a mask bias such that the size of the mask pattern is greater than a target size of the contact hole pattern. In this manner, in the mask design for this type photo-mask, a parameter is the mask bias and the transmittance of the semi-transparent film 12 which are optimized on the conditions that the depth of focus is increased and the side-lobe is not transferred.

As described above, in the above these types of phase-shift photo-mask, the light component having the opposite phase to the light component transmitting the transparent region is leaked by a small amount such that the light components cancel each other at the boundary portion of the main pattern on the imaging plane to form a dark portion, resulting in the abrupt slope of the light intensity distribution of the main pattern. Thus, the depth of focus and resolution can be increased. In the mask design, the photo-mask is optimized on the conditions that the depth of focus is increased and the transferred side-lobe is in an allowable range.

Next, the half-tone type phase-shift photo-mask will be described in detail, taking a specific example. FIGS. 5 to 7 are diagrams showing the relative light intensity distributions in a single contact hole of 0.35 μm isolated from other patterns in a case where different mask biases are applied to the half-tone type phase-shift photo-mask. FIGS. 5 to 7 show the cases of the mask biases of 0.0 μm, 0.05 μm, and 0.1 μm, respectively. In these figures, the solid line, the short dashed line and the long dashed line indicate the cases of Def. (defocus) of 0.0 μm, 0.5 μm and 1.0 μm , respectively.

The simulation condition was NA=0.6, δ=0.3, and λ=365 nm (i-line). As shown in these figures, as the greater mask bias is applied, the light intensity is further increased at the mein pattern. In these figures, the position indicated by the alternate long and short dashed line is 0.35 μm as a target size. As the mask bias is further increased, the light intensity (shown by an arrow) is increased. This means that the pattern can bus formed with a low exposure light amount. First, with the depth of focus, it is important that the pattern size not change even if the focus position is changed. This corresponds to that the light intensity distribution does not change at the positions indicated by the arrow in the figures.

Thus, the light intensity distribution does not almost change at the position shown by the arrow when the mask bias is 0.0 λm and this means that the depth of focus of a wide range can be obtained. As the mask bias is applied, the light intensity distribution greatly changes at the position shown by the arrow in the figure. This means that the change in the pattern size is great when the focus position is changed, that is, that the depth of focus is decreased. Next, the transfer of a side-lobe will be discussed. It can be generally considered that the pattern can be formed while suppressing the transfer of the side-lobe, if the light intensity corresponding to the target size (the position indicated by the arrow in the figures) is greater twice than that of the side-lobe. Thus, in the mask bias, of 0.0 μm, since the side-lobe is resolved when an opening of the target size is formed, this is not in practice. Therefore, it is required for the mask bias to be greater than 0.05 μm. In this manner, the optimal mask bias is 0.05 μm on the conditions that the depth of focus is greater and the transferred side-lobe is in an allowable range. Note that this is only for the single contact hole of 0.35 μm isolated from other patterns. The optimal value is different depending on the arrangement of patterns and the size of the patterns. The optical value is also dependent upon the exposure condition, of course.

Different from the phase shift, there is a deformation illumination method to expand the limitation of photo-lithography. In the deformation illumination method, the shape of effective light source for illuminating the photo-mask is deformed. In this method, the resolution characteristic is increased by the deformation of the shape of the effective light source and control of incident angle of light to the photo-mask. (This method is also called an incident illumination method in that light is obliquely incident.) The deformation illumination method typically has advantage in a periodical pattern. Accordingly, for the isolated pattern such as a contact hole, an auxiliary pattern 6b having the size small than the critical resolution of the exposure apparatus needs to be provided at the peripheral portion of the main pattern 6a such that the pattern becomes similar to a periodic pattern, as shown in FIGS. 8A and 8B. In the combination of the deformation illumination method and the auxiliary pattern type phase-shift photo-mask, there is remains the problem of the transfer of the auxiliary pattern. Therefore, like the phase-shift mask, the auxiliary pattern is optimized on the conditions that the increased depth of focus is obtained and the transferred auxiliary pattern is in an allowable range.

The half-tone mask having the highest practicability will be described taking a specific example. A stepper of i-line having a reduction ratio of ⅕, NA=0.6, δ=0.3 is used and a pattern is formed on a positive type novolac photo-sensitive resin having the thickness of 1.0 μm on a silicon substrate. The transmittance of the half-tone type phase-shift photo-mask used in the experiment is 8% and a mask pattern used in a typical semiconductor device is chosen. A ratio of contact hole and pitch is 1:3. FIG. 9 is a diagram showing a focus characteristic of 0.35 μm contact hole pattern in a normal type photo-mask and a half-tone type phase-shift photo-mask. FIGS. 10A to 10S are the results of the half-tone masks in three types mask biases, i.e., 0.0 μm, 0.5 μm and 0.10 μm . In the figures, the center of the photo-sensitive resin film in a direction of film thickness is the focus position of F=0 and the focus position increases in a direction of semiconductor substrate. These experiment results are well coincident with the results of above-mentioned simulation. First, in comparison of the phase-shift mask with the normal type mask on the same condition, the opening region of 1.0 μm is obtained in the normal type mask while the opening region is increased in the phase-shift mask in any mask bias. However, in the phase-shift mask, the opening region is 2.4 μm in no mask bias. On the other hand, the opening regions of 2.0 μm and 1.4 μm in the mask biases of 0.05 μm and 0.10 μm.respectively. The opening region is narrowed as the mask bias of a greater value is applied.

FIGS. 10A to 10S are diagrams corresponding to SEM photographs for explaining the cross sections of the photo-sensitive resin pattern in a case of use of the half-tone phase-shift photo-mask. In a case of application of the mask bias of 0.10 μm,the transfer of side-lobe is not observed. However, in a case of application of the mask bias of 0.05 μm or 0.0 μm,the film thickness of the photo-sensitive resin is reduced between the adjacent contact holes. This is because the side-lobe patterns are generated in a ring shape in the periphery of contact hole pattern and the generated side-lobe patterns overlaps so that the photo-sensitive resin is exposed and sensitized at the position where the side-lobe patterns are increased in intensity. More particularly, the film thickness reduction amount is near to ½ of the film thickness of the photo-sensitive resin in the more than 0.8 μm focus position. In this case, the mask is not adequate as the etching mask. The position from the main pattern where the side-lobe is formed is dependent upon the focus position and the greater the deviation of focus position is, the greater the distance is. For this reason, the overlapping of the side-lobes changes depending upon the focus position so that the film thickness reduction amount is different. Thus, the transfer of the side-lobe is dependent upon not only the layout of pattern but also the focus position. That is, there is a case that the side-lobe is emphasized at a specific focus position.

Generally, in a semiconductor device pattern, it is rare that a contact hole is formed as an isolated pattern. In many cases, contact holes are collectively formed. Since the contact holes are formed in a thick insulating film such as a silicon oxide film, the selectivity ratio of the photo-sensitive resin and the silicon oxide film in etching is not so much great. For this reason, if the film thickness of the photo-sensitive resin is reduced, there is the possibility that the insulating film is also etched. Further, in a test process after a development process, in a case that an automatic pattern testing apparatus is used, a semiconductor substrate is determined to be defective if a pattern other than the mask pattern is present.

In this manner, as described above, in the half-tone phase-shift photo-mask, if only the opening region is considered, the good result is obtained when no mask bias is applied. Actually, however, the half-tone phase-shift photo-mask is used by applying a mask bias to some extent, in order to prevent the film thickness reduction of the photo-sensitive resin film due to the side-lobes. Further, since the conventional phase-shift photo-mask is optimized under the conditions that the depth of focus is increased and the transfer of side-lobe is decreased, the optimal parameter is not always optimal with respect to the depth of focus. As a result, the effect peculiar to the phase-shift photo-mask cannot be obtained.

SUMMARY OF THE INVENTION

The present invention has, as an object, to provide a method of forming a pattern in which the transfer of a side-lobe can be prevented while the depth of focus is increased.

Another object of the present invention is to provide a method of forming a pattern in which an insoluble layer is formed on the surface of a photo-sensitive resin film.

Still another object of the present invention is to provide a method of forming a pattern in which an exposure process is executed while changing a focus position.

In order to achieve an aspect of the present invention, a method of forming a pattern, includes:

provision a photo-mask including a desired pattern;

coating a photo-sensitive resin film on a semiconductor substrate;

making the surface of the photo-sensitive resin film to have a resistivity against a development solution;

illuminating light to transmit the photo-mask and decreasing the resistivity of only the surface portion of the photo-sensitive resin film corresponding to the desired pattern by the light having transmitting the photomask; and contacting the photo-sensitive layer with the development solution.

In order to achieve another aspect of the present invention, a method of forming a pattern, includes:

providing a photo-mask including a desired pattern;

coating a photo-sensitive resin film on a semiconductor substrate;

forming an insoluble layer against a development solution on the surface of the photo-sensitive resin film;

exposing the photo-sensitive resin film a plurality of times while a focus position changes in a direction of film thickness of the photo-sensitive resin film such that only a portion of the photo-sensitive resin film corresponding to the desired pattern is sensitized by the light having transmitting the photo-mask; and developing the sensitized photo-sensitive layer portion by the development solution.

In a preferred embodiment, the photo-mask is a half-tone type phase-shift photo-mask which includes a transparent region and a semi-transparent region on a transparent substrate such that a light component transmitting the transparent region has a phase different by 180 degrees from that of a light component transmitting the semi-transparent region. Alternatively, the photo-mask has the desired pattern including a light shielding region and a transparent region on a transparent substrate, wherein a pattern of the transparent region includes at least one a first pattern and at least one second pattern, wherein the first pattern has a size of $W1 \geq 0.5 \times \lambda/NA$, where W1 is a pattern size on an imaging plane, $\lambda$ is a wavelength of the light, and NA is a numerical aperture, and the second pattern has a size of $W2<0.5\times\lambda/NA$, where W2 is a pattern size on an imaging plane, wherein a light component transmitting the first pattern has a phase different by 180 degrees from that of a light component transmitting the second pattern. In either case, a mask bias of 0.05 μm may be applied to the photo-mask for 0.35 μm pattern.

In another embodiment, the step of making the surface of the photo-sensitive resin film to have a resistivity against a development solution includes contacting the surface of the photo-sensitive resin film with alkaline solution. The alkaline solution may be TMAH of 2.38 wt % and the contacting time is desirably for more than one minutes time period.

In further another embodiment, the step of illuminating the light a plurality of times includes illuminating the light in a state focusing on the surface of the photo-sensitive resin film and in a state focusing on the boundary between the photo-sensitive resin film and the semiconductor substrate.

BRIEF DESCRIPTION OF THE DRAWINGS

FIGS. 1A to 1D are diagrams of a conventional normal type photo-mask, wherein FIG. 1A is a plan view of the conventional photo-mask, FIG. 1B is a cross sectional view of the photo-mask of FIG. 1A cut along the line A—A', FIG. 1C is a diagram of a light amplitude distribution immediately after transmitting the photo-mask, and FIG. 1D is a diagram of a light intensity distribution on an imaging plane;

FIGS. 2A to 2D are diagrams of a conventional auxiliary pattern type phase-shift photo-mask, wherein FIG. 1A is a plan view of the conventional photo-mask, FIG. 2B is a cross sectional view of the photo-mask of FIG. 1A cut along the line B—B', FIG. 2C is a diagram of a light amplitude distribution immediately after transmitting the photo-mask of FIG. 1A, and FIG. 2D is a diagram of a light intensity distribution on an imaging plane;

FIGS. 3A to 3D are diagrams of a conventional rim type phase-shift photo-mask, wherein FIG. 3A is a plan view of the conventional photo-mask, FIG. 3B is a cross sectional view of the photo-mask of FIG. 3A cut along the line C—C', FIG. #C is a diagram of a light amplitude distribution immediately after transmitting the photo-mask of FIG. 3A, and FIG. 3D is a diagram of a light intensity distribution on an imaging plane;

FIGS. 4A to 4D are diagrams of a conventional half-tone type phase-shift photo-mask, wherein FIGS. 4A is a plan view of the conventional photo-mask, FIG. 4B is a cross sectional view of the photo-mask of FIG. 4A cut along the line D—D', FIG. 4C is a diagram of a light amplitude distribution immediately after transmitting the photo-mask of FIG. 4A, and FIG. 4D is a diagram of a light intensity distribution on an imaging plane;

FIGS. 8A and 8B are diagram of a conventional auxiliary pattern type phase-shift photo-mask, wherein FIG. 8A is a plan view of the conventional photo-mask and FIG. 8B is a cross sectional view of the photo-mask of FIG. 8A cut along the line E—E';

FIGS. 17A and 17B are diagram of a phase-shift photo-mask with an auxiliary pattern, wherein FIG. 17A is a plan view of the photo-mask and FIG. 17B is a cross sectional view of the photo-mask of FIG. 17A cut along the line F—F';

DESCRIPTION OF THE PREFERRED EMBODIMENTS

The pattern forming method according to the present invention will be described below with reference to the accompanying drawings.

Figure 11:
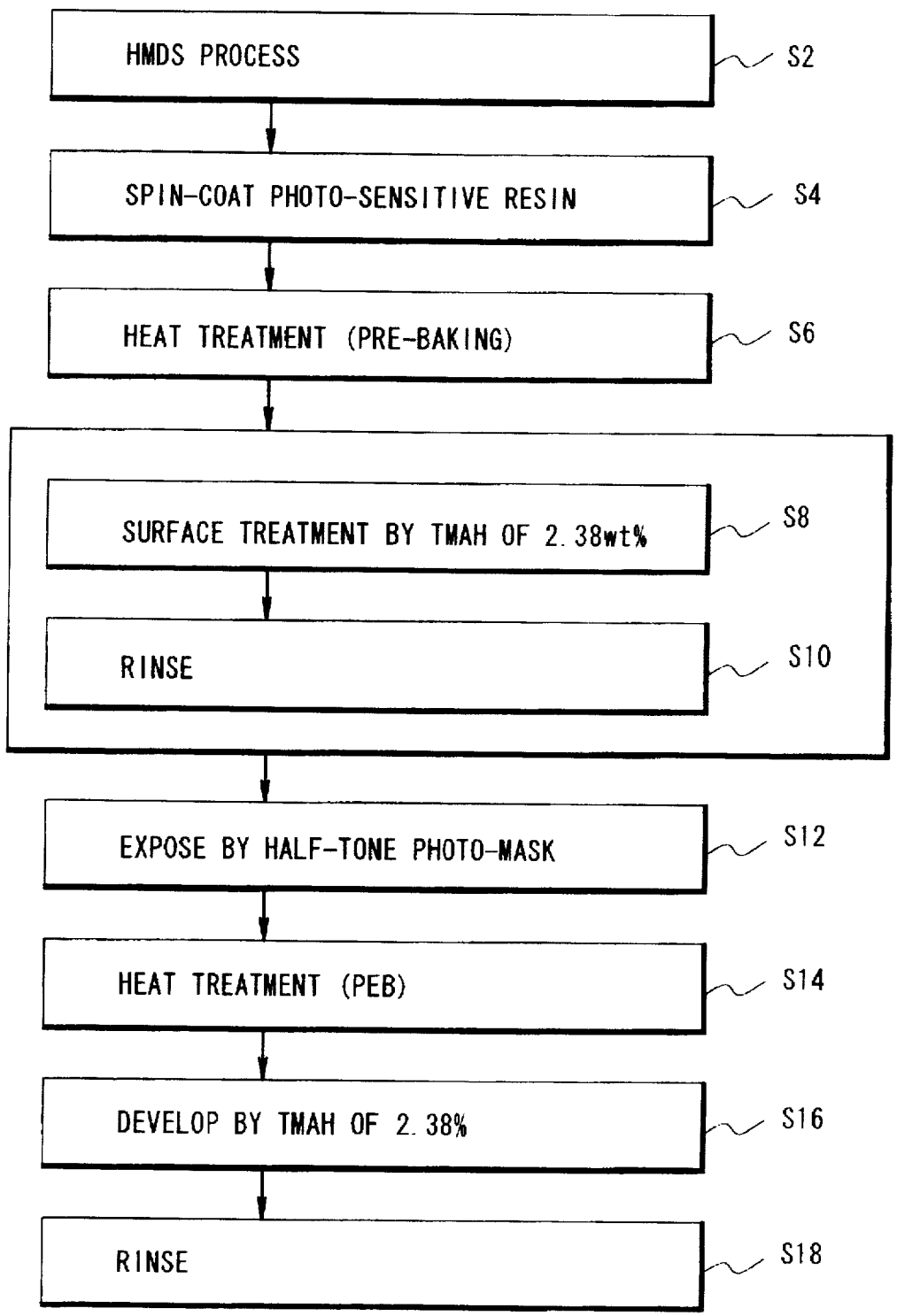
FIG. 11 is a flow chart for explaining a pattern forming method according to the present invention.
Figure 12:
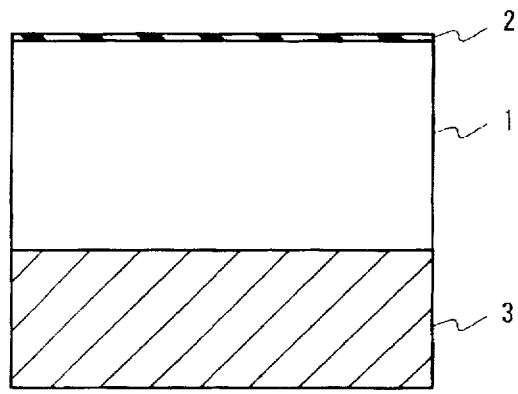
FIG. 12 is a diagram showing the vertical cross section of a semiconductor substrate when an insoluble layer forming process according to the present invention is executed.

The pattern forming method according to the first embodiment of the present invention will be described with reference to FIGS. 11 to 13C. FIG. 11 is a flow chart showing the pattern forming method according to the first embodiment, FIG. 12 is a cross sectional view of a semiconductor substrate on which an insoluble layer is formed, and FIGS. 13A to 13C are diagrams for explaining an exposure process using a phase-shift photo-mask.

First, an HMDS process is executed to a semiconductor substrate 3 to increase the fitness of photo-sensitive resin at a step S2. Then, a positive type novolac photo-sensitive resin such as PFI-26 and PFI-38 commercially available from SUMITOMO CHEMICAL COMPANY Limited is uniformly coated on the semiconductor substrate 3 by a spin coat process to form a photo-sensitive resin film 1 having the thickness of 1 μm at a step S4. Then, at a step S6, heat treatment (pre-baking) is executed to remove unnecessary solvent from the photo-sensitive resin film 1.

Next, an insoluble layer forming process against development solution is executed to the surface of photo-sensitive resin film 1 prior to an exposure process. For this purpose, the surface of photo-sensitive resin film 1 is made to contact a normal alkaline solution (tetramethyl ammonium hydrooxide (TMAH) of 2.38 wt %) at a step S8 and then the substrate is rinsed by pure water at a step S10. Through the above steps, material having high solubility is removed from the surface of photo-sensitive resin film 1 and an insoluble layer 2 having a very low solubility is formed on the surface of photo-sensitive resin film 1 to have a thin thickness less than a few hundreds nanometers, as shown in FIG. 12.

Figure 13A:
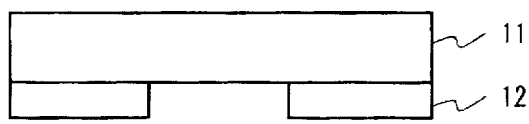
FIG. 13A is a diagram of a phase-shift photo-mask.
Figure 13B:
FIG. 13B is a diagram of the light intensity distribution on an imaging plane and FIG. 13C is a diagram of the exposure state of a semiconductor substrate.
Figure 13C:
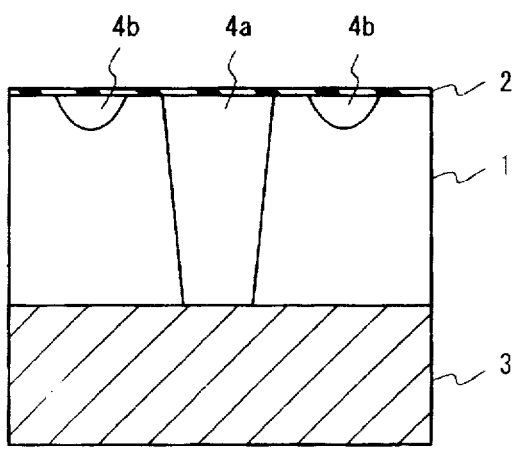

Next, at a step S12, the exposure process is executed using a half-tone type phase-shift photo-mask 11 and 12 having a transmittance of 8% (which is experimentally proved that it has the effect in a range of transmittance of 5% to 20%), as shown in FIG. 13A. At this time, since the light transmitting the half-tone mask 11 and 12 has the light intensity distribution shown in FIG. 13B, the light intensity is strong in an exposure region 4a corresponding to a contact hole pattern as shown in FIG. 13B. As a result, the insoluble layer 2 sufficiently sensitizes the light so that the insoluble layer 2 is changed to have a high solubility, as shown in FIG. 13C.

Figure 14:
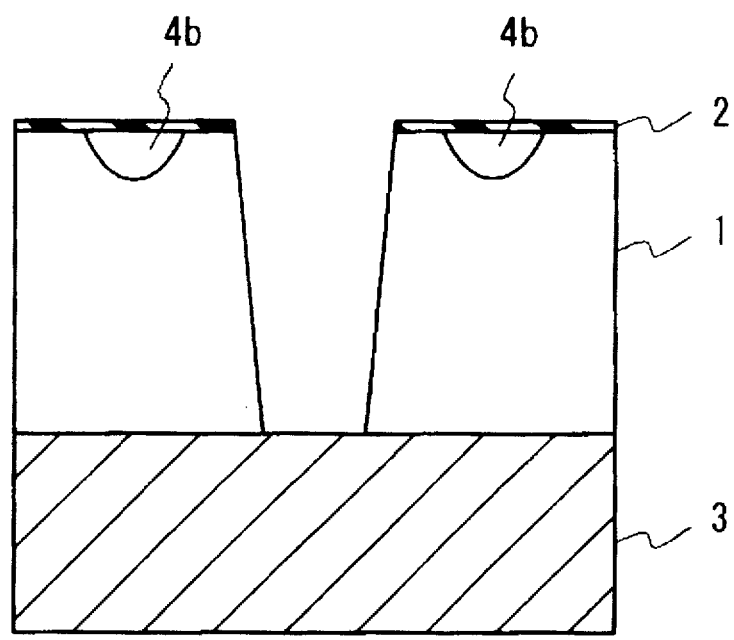
FIG. 14 is a diagram of the semiconductor substrate of the FIG. 13C after a developing process.
Figure 15A:
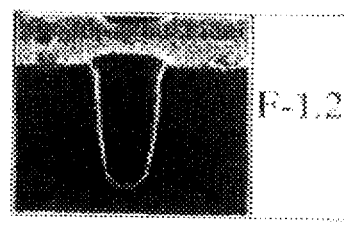
FIGS. 15A to 15M are diagrams corresponding to SEM photographs of the cross sectional views of the photo-sensitive resin for a contact hole pattern when a mask bias is 0.05 μm and the insoluble layer forming process is executed for one minute.
Figure 15B:
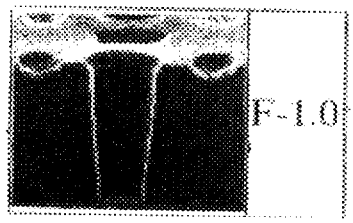
Figure 15C:
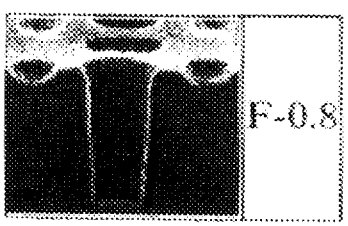
Figure 15D:
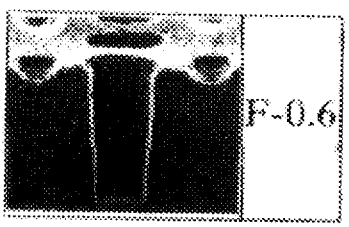
Figure 15E:
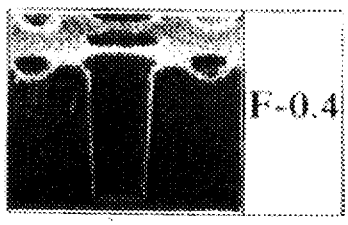
Figure 15F:
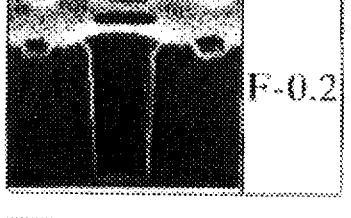
Figure 15G:
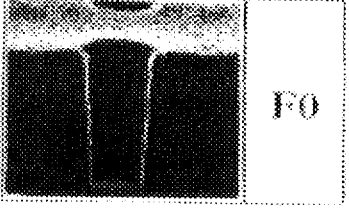
Figure 15H:
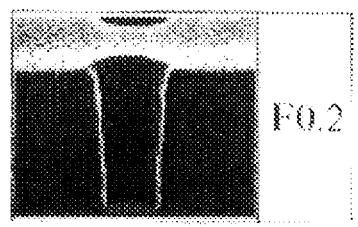
Figure 15I:
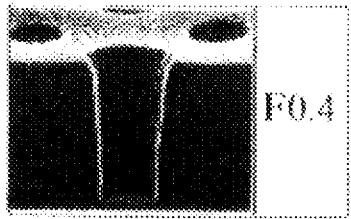
Figure 15J:
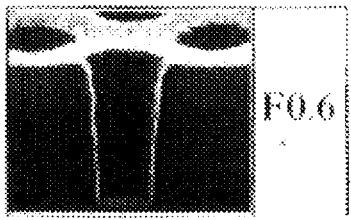
Figure 15K:
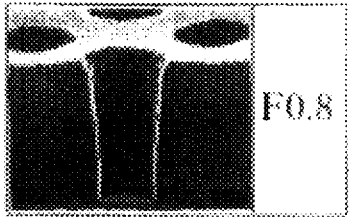
Figure 15L:
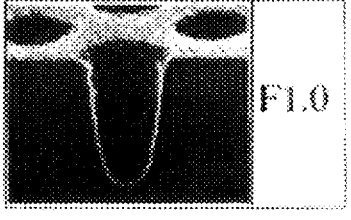
Figure 15M:
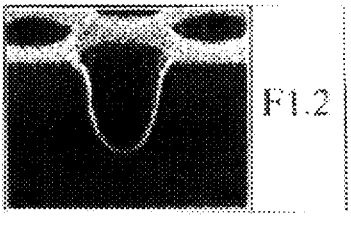
Figure 16A:
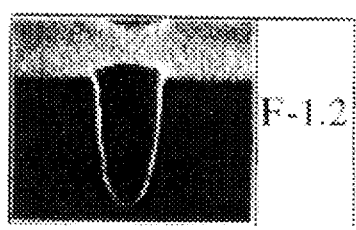
FIGS. 16A to 16M are diagrams corresponding to SEM photographs of the cross sectional views of the photo-sensitive resin for a contact hole pattern when a mask bias is 0.05 μm and the insoluble layer forming process is executed for five minutes.
Figure 16B:
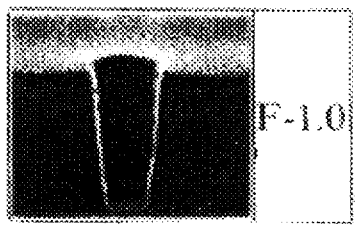
Figure 16C:
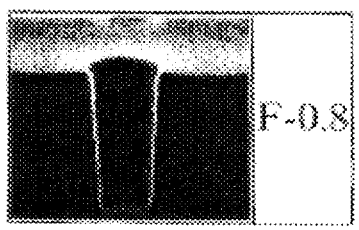
Figure 16D:
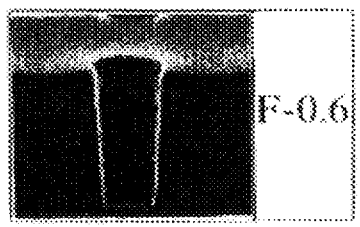
Figure 16E:
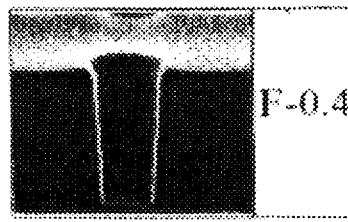
Figure 16F:
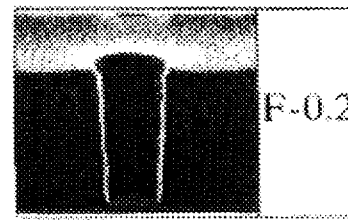
Figure 16G:
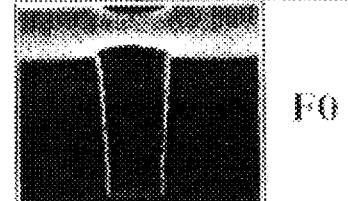
Figure 16H:
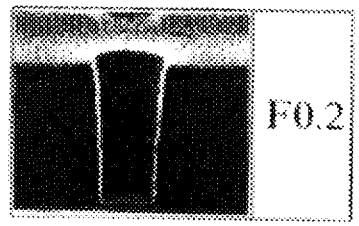
Figure 16I:
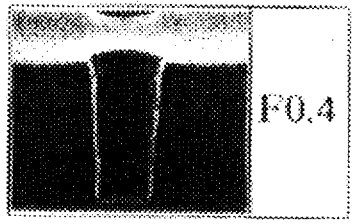
Figure 16J:
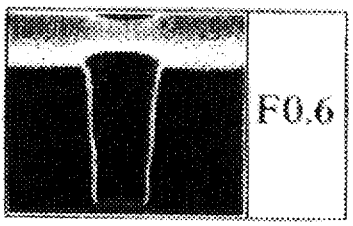
Figure 16K:
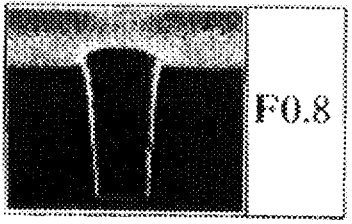
Figure 16L:
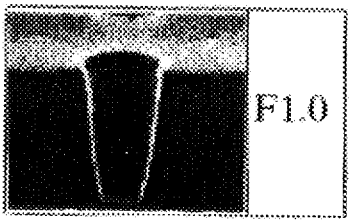
Figure 16M:
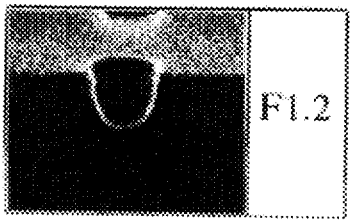

On the other hand, however, since the light intensity is weak in a side-lobe region 4b peripheral to the contact hole pattern, the insoluble layer 2 maintain a low solubility in the side-lobe region. Subsequently, heat treatment generally called post-exposure baking (PEB) is executed at a step S14 for purpose of removing the influence of standing wave of light in the photo-sensitive resin film 1. Thereafter, a developing process is executed at a step S16. In the developing process, the photo-sensitive resin film 1 on the semiconductor substrate 1 is made to contact the alkaline solution TMAH of 2.38% for 60 seconds like the above insoluble layer forming process. FIG. 14 is a diagram showing the cross section of the photo-sensitive resin film 1 on the semiconductor substrate 3. It can be seen that the insoluble layer 2 over the contact hole region as a main pattern is instantaneously made soluble and developed as in the conventional technique. Thus, the insoluble layer 2 is formed but the insoluble layer 2 changes into a soluble layer by illuminating a strong intensity of light, -that is, the solublity of the insoluble layer 2 can be controlled by light. On the other hand, since the insoluble layer 2 over the side-lobe region 4b has a low solubility the insoluble layer 2 is not made soluble in a normal development time, e.g., 60 seconds. In this manner, by forming the thin insoluble layer 2 on the surface of photo-sensitive resin film 1, the transfer of side-lobe can be prevented while the transfer of a main pattern is allowed. Last, the semiconductor substrate is rinsed by pure water at a step S18.

Next, the prevention of the transfer of side-lobe will be described below. FIGS. 15A to 15M and 16A to 16M are diagrams corresponding to SEM photographs of the cross sections of photo-sensitive resin film patterns. FIGS. 15A to 15M and FIGS. 16A to 16M are the diagrams when the insoluble layer forming process by the alkaline solution is executed for one minutes and five minutes, in a case that the contact hole pattern of 0.35 μm is employed and a mask bias of 0.05 μm is applied, respectively. As seen from these figures, the insoluble layer forming process has the advantage of preventing the transfer of side-lobe. The prevention characteristic has dependency on the process time a little but the advantage is constant for more than one minute process time. In this manner, the transfer of side-lobe can be prevented even when a mask bias of 0.05 μm is applied. Further, the shape of a contact hole pattern as a main pattern do not change and the dimensions of the pattern also does not change. By executing the insoluble layer forming process for one minute, it is made possible to change the mask bias from 0.10 μm as a conventional value to 0.05 μm for the conditions. As a result, the depth of focus can be also increased from 1.4 μm as a conventional value to 2.0 μm.

The above description is made taking i-line lithography as an example. However, the exposure process is not limited to i-line and light having another wavelength such as g-line or X-ray may be used. In this case, the same advantage can be obtained.

Figure 17A:
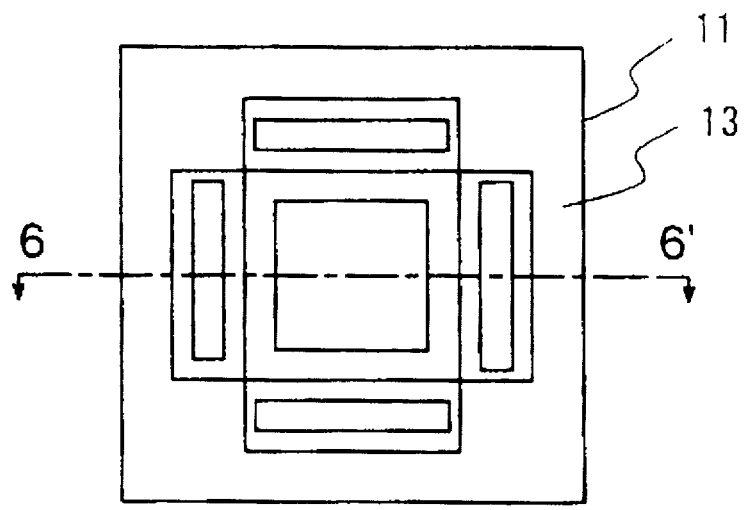
Figure 17B:
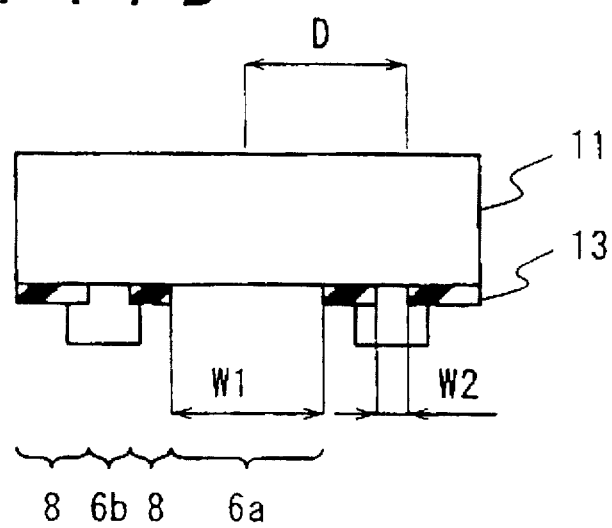

The pattern forming method according to the second embodiment of the present invention will be described. The exposure condition is the same as in the first embodiment. FIG. 17A is a plan view of a phase-shift photo-mask with auxiliary patterns and FIG. 17B is a cross sectional view of the photo-mask of FIG. 17A cut along the line F—F'. As seen from the figures, in the peripheral portion of the first transparent region 6a as the main pattern to be transferred on the photo-sensitive resin film are provided the second transparent regions 6b having a dimension smaller than the critical resolution of the exposure apparatus. In order to form a contact hole pattern of 0.35 μm on a semiconductor substrate 3, the first transparent region 6a has the dimension W1 of 1.75 µm and the second transparent region 6b as an auxiliary pattern has the dimension W2 of 1.0 µm. The distance D between the center of the first transparent region 6a and the center of the second transparent region 6b is approximately 3.5 µm. Like the first embodiment, the photo-sensitive resign film 1 is processed by alkaline solution to form an insoluble layer prior to the exposure[] using the phase-shift photo-mask.

In an electron beam method used for manufacturing a mask, it is known as proximity effect that the sizes of patterns change due to charge-up and heat when fine patterns are collectively drawn. For this reason, it is difficult to precisely control the dimensions of the second transparent region 6b. However, in the embodiment, since the insoluble layer forming process of the photo-sensitive resin film is employed, the unnecessary film thickness reduction of the photo-sensitive resin film 1 can be prevented even if the dimensions of the second transparent region 6b is formed large to some extent. In the conventional pattern forming method, when the dimension of the second transparent region 6b is 1.0 µm, the image of the region 6b is slightly transferred on the surface of photo-sensitive resin film 1. Further, when the size of the region 6b is greater than 1.25 µm, the film thickness of the photo-sensitive resin film 1 is greatly reduced to ½ of the film thickness or more. However, in the present invention, the transfer of the second transparent region 6b can be completely prevented even if the second transparent region 6b has the dimension of 1.25 µm. Therefore, the precision of the mask dimension can be varied and there is advantage in that the mask manufacture become easy. Note that the exposure light is not limited to the i-line in the embodiment but light having another wavelength such as g-line or X-ray may be used.

Next, the pattern forming process according to the third embodiment will be described below. In the third embodiment, the exposure condition is the same as in the first and second embodiment. Also, a half-tone type phase-shift photo-mask having a transmittance of 8% is used by applying a mask bias of 0.05 µm.

Figure 18A:
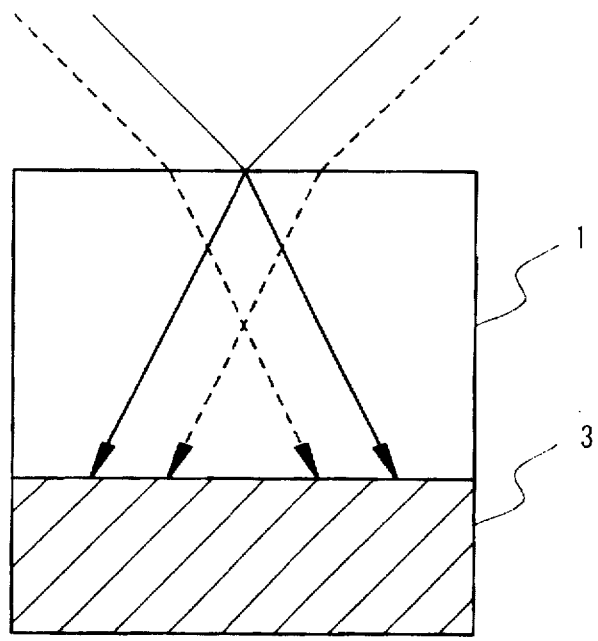
FIGS. 18A and 18B are diagrams for explaining the exposure process.
Figure 18B:
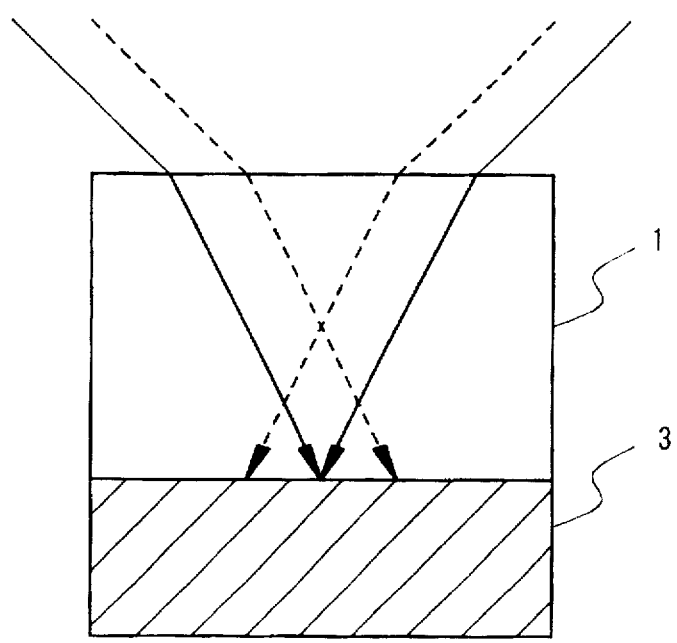

FIGS. 18A and 18B are diagrams for explaining the exposure process in the third embodiment. As shown in FIG. 18A, the light is focused on the surface of photo-sensitive region film 1 and the exposure process is executed by ½ of the exposure light amount adaptive for the photo-sensitive resin film 1, e.g., for ½ time period of the total exposure time period. Subsequently, as shown in FIG. 18B, the light is focused on the interface between the photo-sensitive resin film 1 and the semiconductor substrate 3 and the exposure process is executed for the remaining ½ exposure light amount.

Figure 1A:
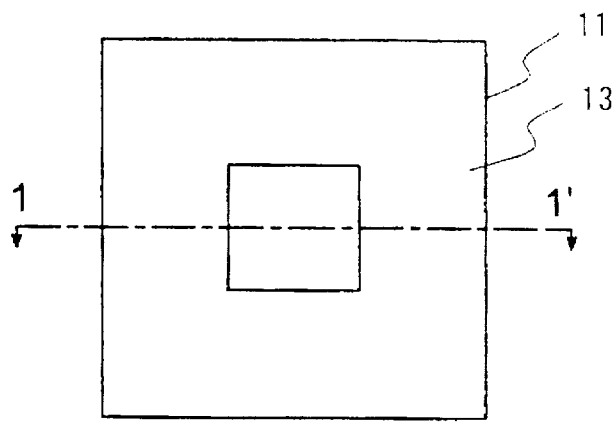
Figure 1B:
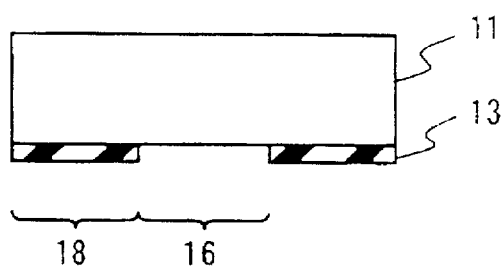
Figure 1C:
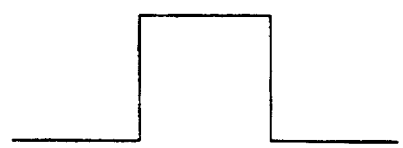
Figure 1D:
Figure 2A:
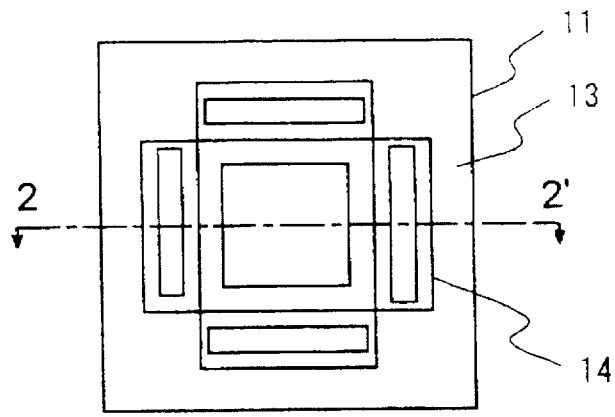
Figure 2B:
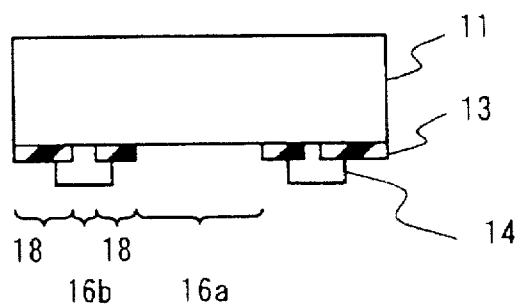
Figure 2C:
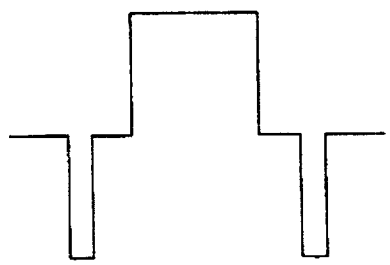
Figure 2D:
Figure 3A:
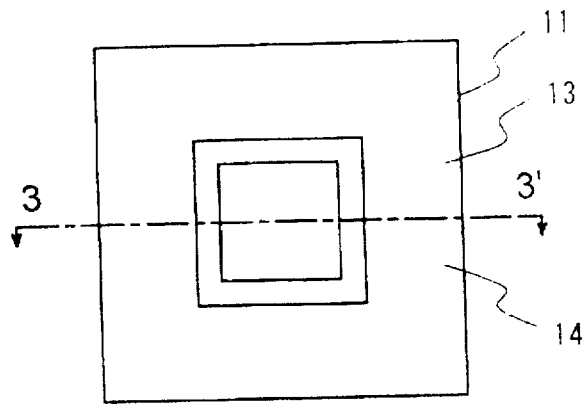
Figure 3B:
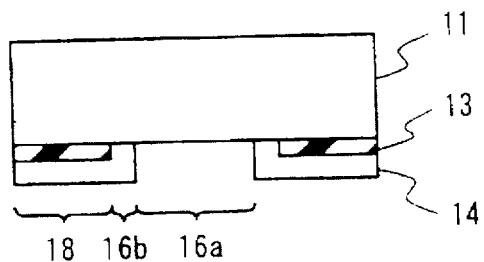
Figure 3C:
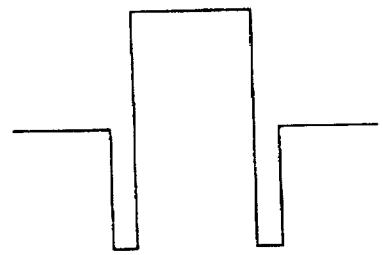
Figure 3D:
Figure 4A:
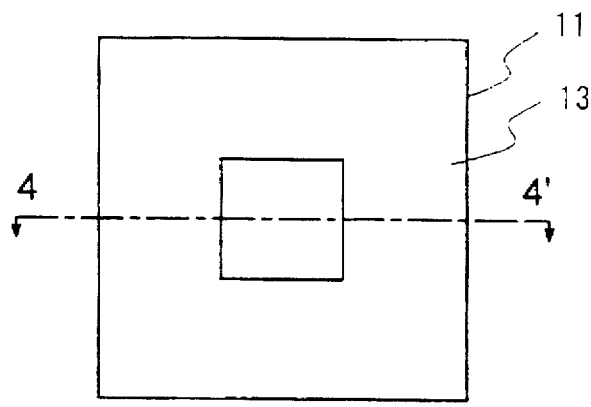
Figure 4B:
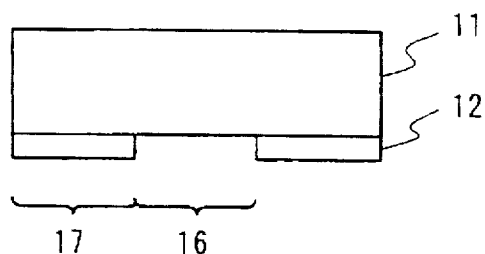
Figure 4C:
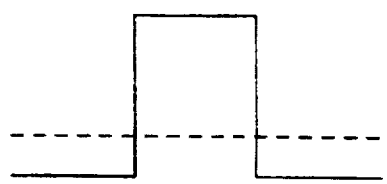
Figure 4D:
Figure 5:
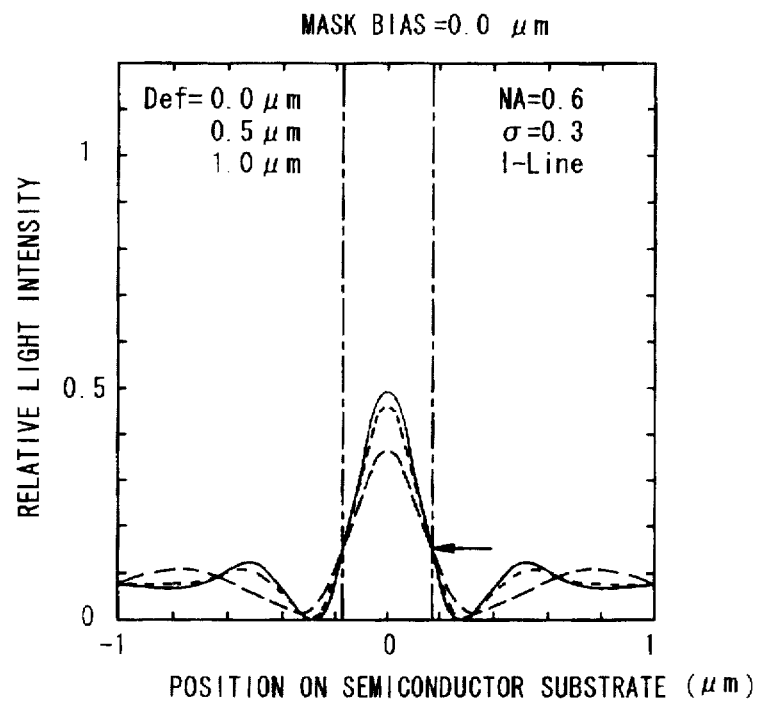
FIG. 5 is a diagram showing the light intensity distribution in 0.35 μm isolated contact hole when a mask bias of 0.0 μm is applied to the conventional half-tone type phase-shift photo-mask.
Figure 6:
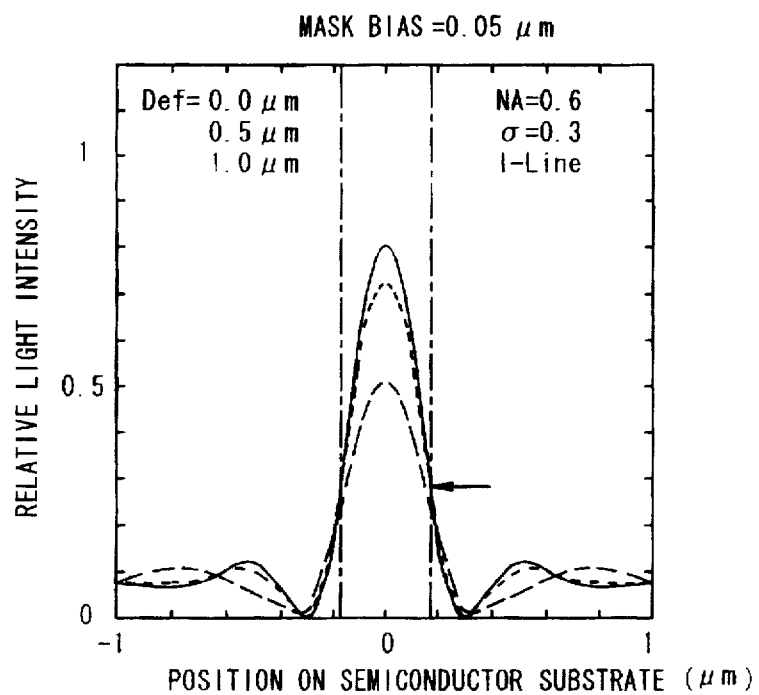
FIG. 6 is a diagram showing the light intensity distribution of 0.35 μm isolated contact hole when a mask bias of 0.05 μm is applied to the conventional half-tone type phase-shift photo-mask.
Figure 7:
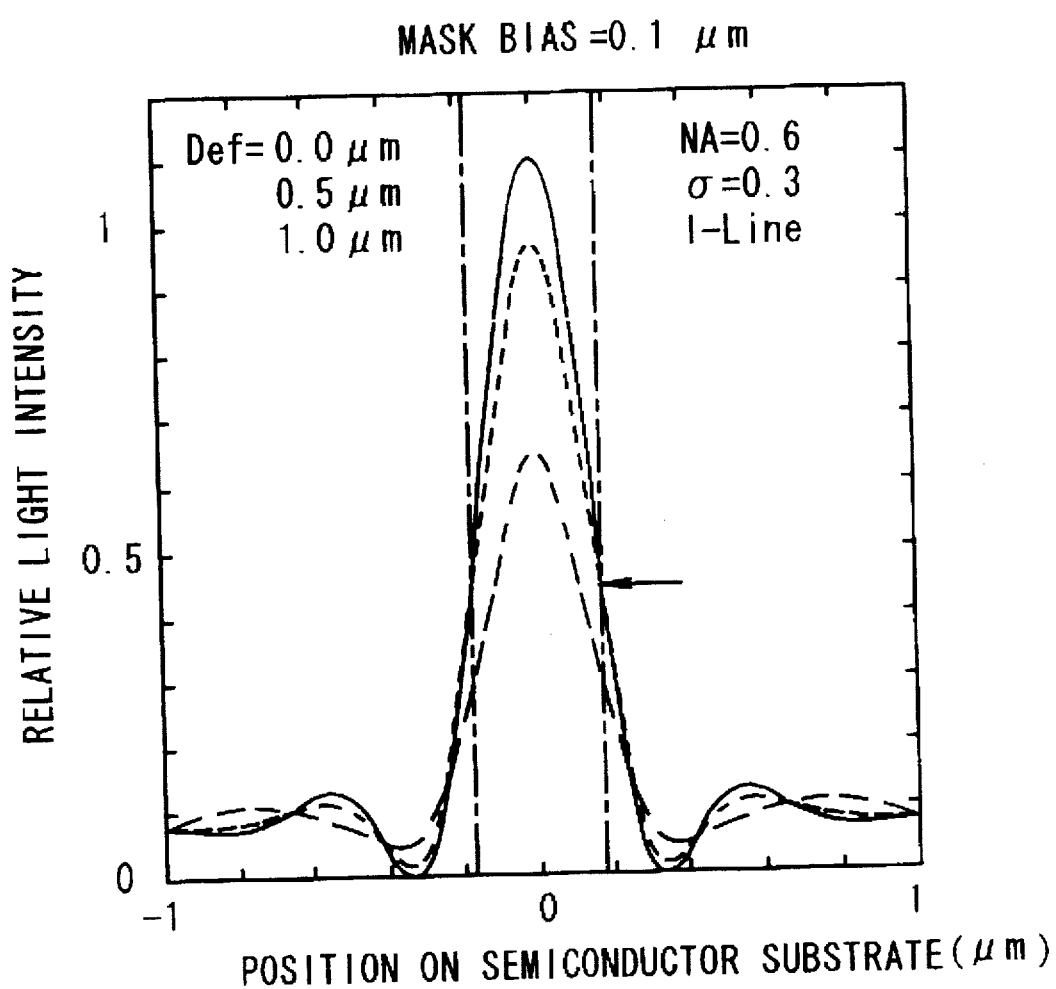
FIG. 7 is a diagram showing the light intensity distribution of 0.35 μm isolated contact hole when a mask bias of 0.1 μm is applied to the conventional half-tone type phase-shift photo-mask.
Figure 8A:
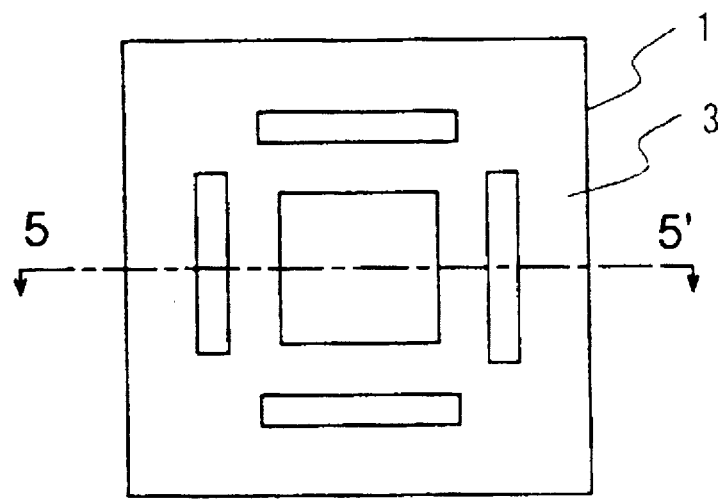
Figure 8B:
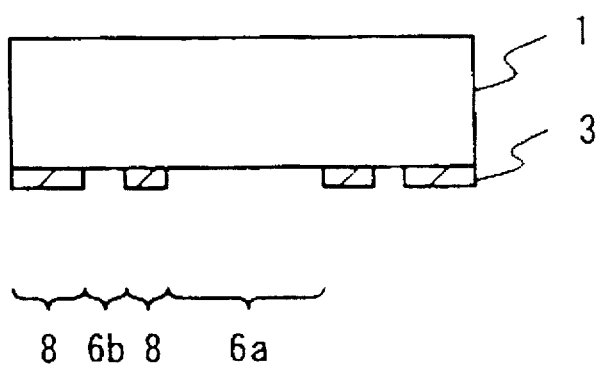
Figure 9:
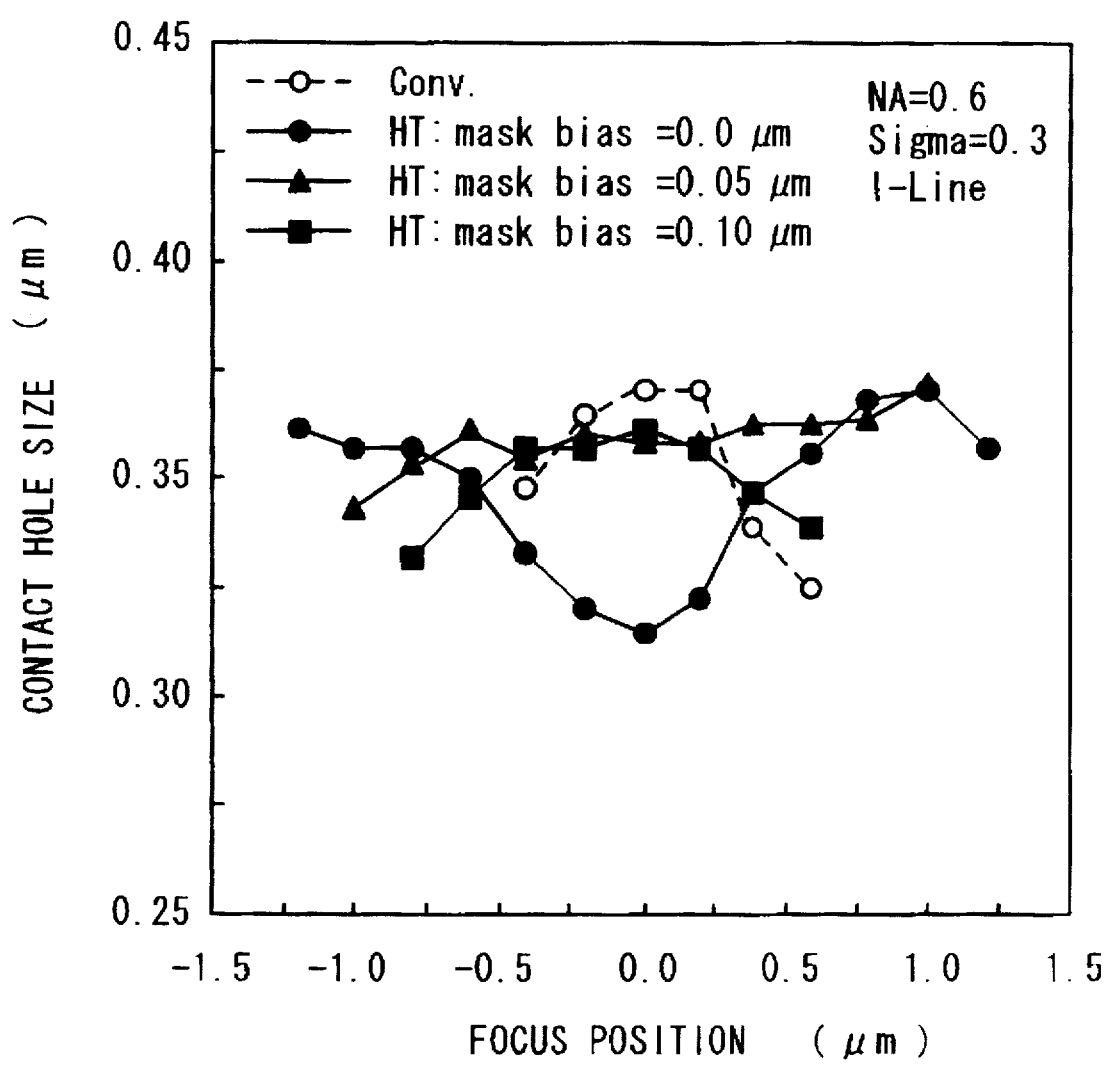
FIG. 9 is a diagram showing the focus characteristic of a conventional normal photo-mask and a half-tone type phase-shift photo-mask in a 0.35 μm contact hole pattern.
Figure 10A:
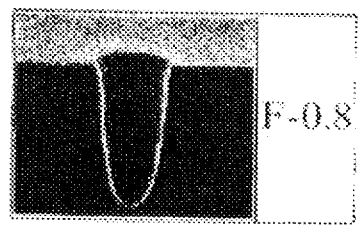
FIGS. 10A to 10S are diagrams corresponding to SEM photographs of the cross sections of a photo-sensitive resin for a contact hole when a conventional half-tone type phase-shift photo-mask is used.
Figure 10B:
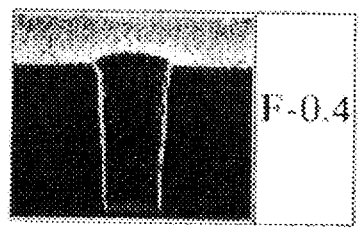
Figure 10C:
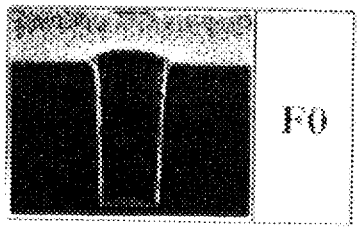
Figure 10D:
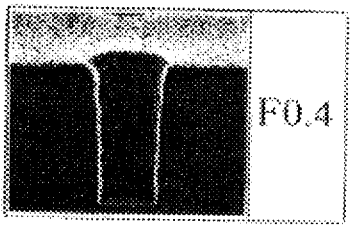
Figure 10E:
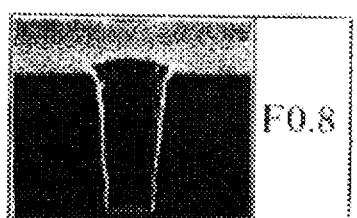
Figure 10F:
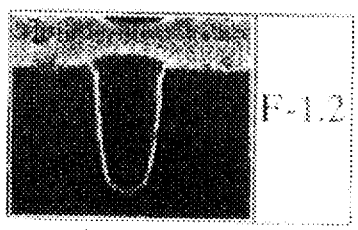
Figure 10G:
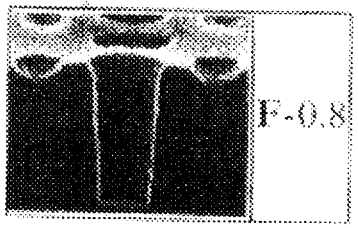
Figure 10H:
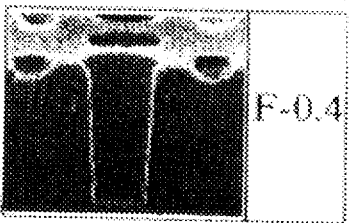
Figure 10I:
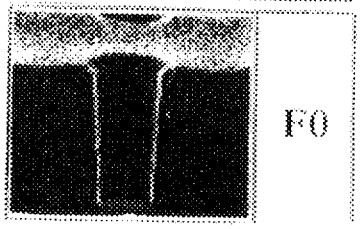
Figure 10J:
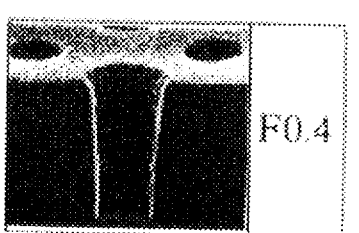
Figure 10K:
Figure 10L:
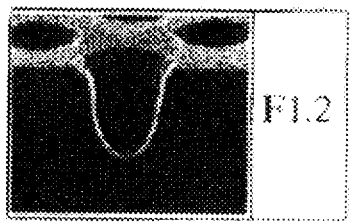
Figure 10M:
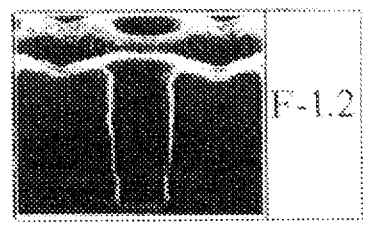
Figure 10N:
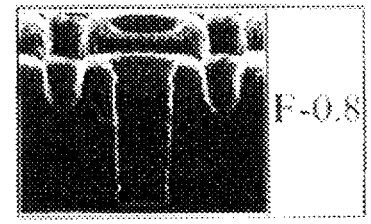
Figure 10O:
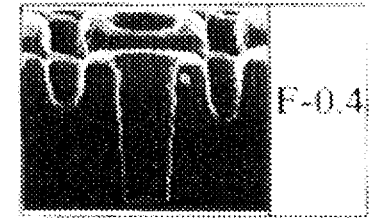
Figure 10P:
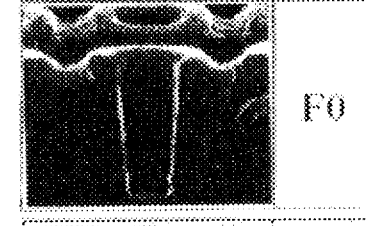
Figure 10Q:
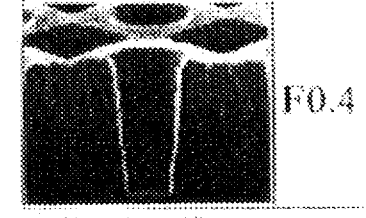
Figure 10R:
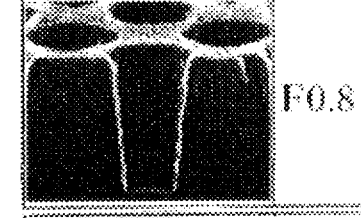
Figure 10S:
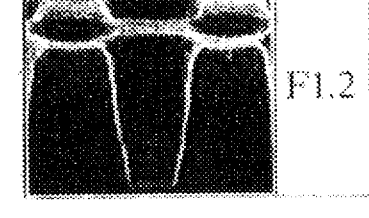
Figure 19:
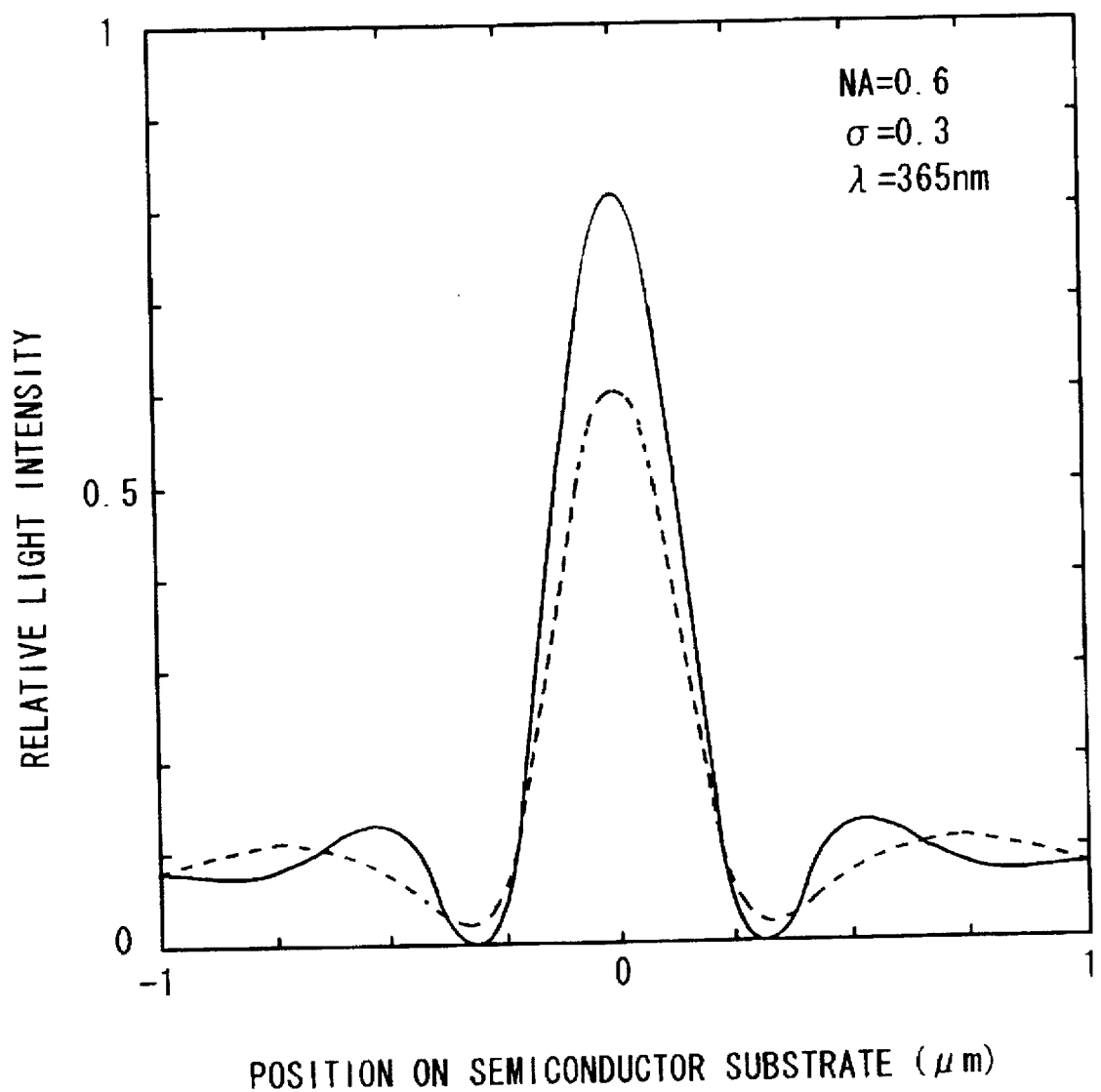
FIG. 19 is a diagram showing a relation of the relative light intensity distribution and the position on a semiconductor substrate.

The effect of the third embodiment will be described. As seen from the FIGS. 18A and 18B, the best focus position (F =0 µm) is generally accomplished when the focus is positioned on ½ of the film thickness of the photo-sensitive resin film 1. However, considering the transfer of the side-lobe, the focus position is changed since it is a phenomenon on the surface of photo-sensitive resin film. FIG. 19 is a diagram showing a relation of the position on the semiconductor substrate and the relative light intensity. If the focus position is located on the surface of photo-sensitive resin film 1 for exposure, the side-lobe is formed in the nearest portion to the contact hole. A simulation result of the light intensity distribution at that time is indicated by a solid line in FIG. 19. Next, the focus position is located on the bottom of photo-sensitive resin film 1 and the exposure process is executed. In this case, as shown in FIG. 8B, the displacement of focus on the photo-sensitive resin film 1 is approximately 0.8 µm but not 1 µm as the film thickness of the photo-sensitive resin film 1 because the refractive angle is different from the incident angle from air to the photo-sensitive resin film. The light intensity distribution at that time on the surface photo-sensitive resin film 1 is indicated by a dashed line in FIG. 19. Thus, by exposing the photo-sensitive resin film while changing the focus position in a direction of film thickness of the photo-sensitive resin film 1, the position of the side-lobe to be generated is displaced. Therefore, only a specific portion of the photo-sensitive resin film 1 can be prevented from being exposed.

The method of exposing at a plurality of focus positions to a contact hole pattern is well known as a multiple focus points exposure method or FLEX method. However, in a typical multiple focus points exposing method, a plurality of focus positions are selected such that the opening region can be enlarged. If the distance between focus positions is too large, the side-lobe is generated on only a portion apart from the contact hole pattern and the side-lobe is easy to be generated oppositely. There is a problem in that the dimensions of a pattern transferred on the photo-sensitive resin film 1 changes greatly if the dimension of a mask pattern changes, because the light intensity distribution is not abrupt in slope in the contact hole pattern rather than a line and space pattern. When the focus position are intended displaced, the slope of light intensity distribution becomes further softened so that the influence of the dimensions of mask pattern becomes greater. That is, if the size of mask pattern is slightly small, there is a case that the opening having sufficient size cannot be obtained. For this reason, in the present embodiment, the distance between the focus positions is selected to be necessary and sufficient to prevent the transfer of the side-lobe and the effect of the conventional multiple focus points exposing method, i.e., the enlargement of the opening region is prevented.

Note that the third embodiment was described taking the half-tone type phase-shift photo-mask as an example but the same effect can be obtained in a case where a photo-mask having sub-peaks is used. Further, the light is not limited to i-line and light having another wavelength such as g-line or X-ray may be used.

The insoluble layer forming process was proposed as a method of obtaining a vertical cross section surface of a photo-sensitive resin film, as shown in JP-A-Tokukaihei31-170935. In the present invention, since the insoluble layer is formed as a thin film on the horizontal surface of photo-sensitive region film and the body of the resin film is not influenced by the formation of thin insoluble layer, the process is stable. Originally, since the contact hole pattern has a small process margin, the size of pattern changes greatly due to causes such as exposure light amount, focus position and mask size. For this reason, when a new process is added, the influence of the new process must be studied. However, in the present invention, such study is unnecessary and the process is stable.

What is claimed is:

1. A method of forming a pattern, comprising steps of:

providing a photo-mask including said pattern;

coating a photo-sensitive resin film on a semiconductor substrate;

forming a surface of said photo-sensitive resin film to have a resistivity against a development solution;

illuminating said pattern on said surface of said photo-sensitive resin film through said photo-mask, said step of illuminating decreasing said resistivity of a pattern portion of said surface of said photo-sensitive resin film subjected to said illumination; and contacting said photo-sensitive resin film with a development solution, wherein said photo-mask comprises a phase-shift photo-mask and includes a transparent region and a semi-transparent region positioned on a transparent substrate, wherein a first light component transmitted through said transparent region has a phase different than that of a second light component transmitted through said semi-transparent region, wherein said step of illuminating includes illuminating said photo-sensitive resin film N times, wherein N is an integer greater than one, and, during each of said N illuminations, changing a focus position in a direction of a film thickness of said photo-sensitive resin film, and wherein each of said N illuminations is controlled to be 1/N of an amount of light for transferring said pattern to said photo-sensitive resin film.

2. A method of forming a pattern according to claim 1, wherein said step of changing a focus position includes focusing on said surface of said photo-sensitive resin film and focusing on a boundary between said photo-sensitive resin film and said semiconductor substrate.

3. A method of forming a pattern according to claim 1, wherein said step of changing a focus position changes a position where a side-lobe is generated during each of said N illuminations.

4. A method of forming a pattern according to claim 1, wherein said step of changing a focus position distributes side-lobes such that transfer of side-lobes to said photo-sensitive resin film is prevented.

5. A method of forming a pattern comprising steps of:
providing a photo-mask including said pattern;
coating a photo-sensitive resin film on a semiconductor substrate;
forming a surface of said photo-sensitive resin film to have a resistivity against a development solution;
illuminating said pattern on said surface of said photo-sensitive resin film through said photo-mask, said step of illuminating decreasing said resistivity of a pattern portion of said surface of said photo-sensitive resin film subjected to said illumination; and
contacting said photo-sensitive resin film with a development solution,
wherein said photo-mask comprises a phase-shift photo-mask and includes a transparent region and a semi-transparent region positioned on a transparent substrate, wherein a first light component transmitted through said transparent region has a phase different than that of a second light component transmitted through said semi-transparent region.

6. A method of forming a pattern comprising steps of:
providing a photo-mask including said pattern;
coating a photo-sensitive resin film on a semiconductor substrate;
forming a surface of said photo-sensitive resin film to have a resistivity against a development solution;
illuminating said pattern on said surface of said photo-sensitive resin film through said photo-mask, said step of illuminating decreasing said resistivity of a pattern portion of said surface of said photo-sensitive resin film subjected to said illumination; and
contacting said photo-sensitive resin film with a development solution, wherein said photo-mask includes a light shielding region and a transparent region positioned on a transparent substrate, wherein said transparent region includes at least one first pattern and at least one second pattern, wherein said first pattern has a size of $W1 \geq 0.5 \times \lambda/NA$, where W1 comprises a first pattern size on an imaging plane, $\lambda$ comprises a wavelength of said light, and NA comprises a numerical aperture, wherein said second pattern has a size of $W2 \leq 0.5 \times \lambda/NA$, where W2 comprises a second pattern size on said imaging plane, and wherein a first light component transmitted through said first pattern has a phase different than that of a second light component transmitted through said second pattern.

7. A method of forming a pattern according to claim 6, wherein said illuminating step includes illuminating said photo-sensitive resin film N times, wherein N is an integer greater than one, and, during each of said N illuminations, changing a focus position in a direction of a film thickness of said photo-sensitive resin film, and wherein each of said N illuminations is controlled to be 1/N of an amount of light for transferring said pattern to said photo-sensitive resin film.

8. A method of forming a pattern according to claim 7, wherein said step of changing a focus position includes focusing on said surface of said photo-sensitive resin film and focusing on a boundary between said photo-sensitive resin film and said semiconductor substrate.

9. A method of forming a pattern, comprising steps of:
providing a photo-mask including said pattern;
coating a photo-sensitive resin film on a substrate;
illuminating said pattern on a surface of said photo-sensitive resin film through said photo-mask N times, wherein N is an integer greater than one, and, during each of said N illuminations, changing a focus position in a direction of a film thickness of said photo-sensitive resin film, wherein each of said N illuminations is controlled to be 1/N of an amount of light for transferring said pattern to said photo-sensitive resin film; and
contacting said photo-sensitive resin film with a development solution,
wherein said photo-mask comprises a phase-shift photo-mask and includes a transparent region and a semi-transparent region positioned on a transparent substrate, wherein a first light component transmitted through said transparent region has a phase different than that of a second light component transmitted through said semi-transparent region.

10. A method of forming a pattern comprising steps of:
providing a photo-mask including said pattern;
coating a photo-sensitive resin film on a semiconductor substrate;
forming an insoluble layer on said semiconductor substrate, said insoluble layer being insoluble against a development solution;
exposing said pattern on a surface of said photo-sensitive resin film to light through said photo-mask N times, wherein N is an integer greater than one, and, during each of said N exposures, changing a focus position in a direction of a film thickness of said photo-sensitive resin film; and
developing said pattern on said photo-sensitive resin film with said development solution.

wherein said photo-mask comprises a phase-shift photo-mask and includes a transparent region and a semi-transparent region positioned on a transparent substrate, wherein a first light component transmitted through said transparent region has a phase different than that of a second light component transmitted through said semi-transparent region, and wherein each of said N exposures is controlled to be 1/N of an amount of light for transferring said pattern to said photo-sensitive resin film.

11. A method of forming a pattern according to claim 10, wherein said step of changing a focus position includes focusing on the surface of said photo-sensitive resin film and focusing on a boundary between said photo-sensitive resin film and said semiconductor substrate.

12. A method of forming a pattern comprising steps of:

providing a photo-mask including said pattern;

coating a photo-sensitive resin film on a semiconductor substrate;

forming an insoluble layer on said semiconductor substrate, said insoluble layer being insoluble against a development solution;

exposing said pattern on a surface of said photo-sensitive resin film to light through said photo-mask N times, wherein N is an integer greater than one, and, during each of said N exposures, changing a focus position in a direction of a film thickness of said photo-sensitive resin film; and developing said pattern on said photo-sensitive resin film with said development solution, wherein said photo-mask includes a light shielding region and a transparent region positioned on a transparent substrate, wherein said transparent region includes at least one first pattern and at least one second pattern, wherein said first pattern has a size of W1≧0.5×λ/NA, where W1 comprises a first pattern size on an imaging plane, λ comprises a wavelength of said light, and NA comprises a numerical aperture, and said second pattern has a size of W2≦0.5×λ/NA, where W2 comprises a second pattern size on said imaging plane, and wherein a light component transmitted through said first pattern has a phase different than that of a light component transmitted through said second pattern, and wherein each of said N exposures is controlled to be 1/N of an amount of light for transferring said pattern to said photo-sensitive resin film.

13. A method of forming a pattern according to claim 12, wherein said step of changing a focus position includes focusing on said surface of said photo-sensitive resin film and focusing on a boundary between said photo-sensitive resin film and said semiconductor substrate.

14. A method of forming a pattern comprising steps of:

providing a photo-mask including said pattern;

coating a photo-sensitive resin film on a substrate;

illuminating said pattern on a surface of said photo-sensitive resin film through said photo-mask N times, wherein N is an integer greater than one, and, during each of said N illuminations, changing a focus position in a direction of a film thickness of said photo-sensitive resin film, wherein each of said N illuminations is controlled to be 1/N of an amount of light for transferring said pattern to said photo-sensitive resin film; and contacting said photo-sensitive resin film with a development solution, wherein said photo-mask includes a light shielding region and a transparent region positioned on a transparent substrate, and wherein said transparent region includes at least one first pattern and at least one second pattern, wherein said first pattern has a size of W1≧0.5×λ/NA, where W1 comprises a first pattern size on an imaging plane, λ comprises a wavelength of said light, and NA comprises a numerical aperture, and said second pattern has a size of W2≦0.5×λ/NA, where W2 comprises a second pattern size on said imaging plane, and wherein a light component transmitted through said first pattern has a phase different than that of a light component transmitted through said second pattern.

* * * * *